United States Patent [19]

Maejima

[11] Patent Number: 4,972,509
[45] Date of Patent: Nov. 20, 1990

[54] BAND SWITCHING CIRCUIT OF A TUNER

[75] Inventor: Kazuhiko Maejima, Kanagawa, Japan

[73] Assignee: Sony Coporation, Tokyo, Japan

[21] Appl. No.: 368,827

[22] Filed: Jun. 20, 1989

[30] Foreign Application Priority Data

Jun. 20, 1988 [JP] Japan ................. 63-151531
Jun. 20, 1988 [JP] Japan ................. 63-151530

[51] Int. Cl.⁵ .......................... H03J 5/24; H04B 1/16
[52] U.S. Cl. .................... 455/180; 455/188;
455/191; 455/266; 455/340; 334/15; 334/56
[58] Field of Search ............. 455/188, 181, 191, 266,
455/340, 180; 334/15, 56, 47

[56] References Cited

U.S. PATENT DOCUMENTS

| | | | |
|---|---|---|---|
| 4,070,627 | 1/1978 | Jasinski et al. ................. | 455/124 |
| 4,168,478 | 9/1979 | Schriegral ................. | 333/135 |
| 4,291,290 | 9/1981 | Ijichi et al. ................. | 334/1 |
| 4,555,808 | 11/1985 | Fujimoto ................. | 455/180 |
| 4,555,809 | 11/1985 | Carlson ................. | 455/180 |
| 4,749,974 | 7/1988 | Yamamoto et al. ................. | 334/56 |
| 4,876,739 | 10/1989 | Wa et al. ................. | 455/266 |

*Primary Examiner*—Reinhard J. Eisenzopf
*Assistant Examiner*—Lisa Charouel
*Attorney, Agent, or Firm*—Lewis H. Eslinger; Jay H. Maioli

[57] ABSTRACT

In a tuner circuit in which a plurality of band signals are received by a single common high frequency amplifier stage, a band switching circuit switches a resonant circuit to λ/2 type when the amplifier stage receives the highest band signals and to λ/4 type when the amplifier stage receives band signals other than the highest band signals.

10 Claims, 5 Drawing Sheets

BAND SWITCHING CIRCUIT OF A TUNER

BACKGROUND OF THE INVENTION

1. Field of the Invention

The present invention relates generally to tuner circuits and, more particularly, is directed to a tuner circuit for use with a color television receiver for receiving, for example, a CATV broadcast or a tuner circuit for use with a videotape recorder for recording the CATV broadcast.

2. Description of the Prior Art

Recently, with the spread of CATV broadcast, many broadcast channels from VHF band to UHF band have become available, for example, in the United States of America. Frequently color television receivers and the videotape recorder are designed to have a tuner circuit which is capable of receiving these broadcasts ranging from VHF low band to the UHF band.

The above-mentioned tuner circuit is generally formed so as to receive 4 band signals (UHF band and VHF 3 bands). The VHF 3 band portions are subdivided to provide the lowest frequency band, the highest frequency band and the intermediate frequency band. The lowest frequency band will hereinafter be referred to as a VL band and covers from, for example, on Air broadcast 2CH (55.25 MHz) to CATV A-3CH broadcast (103.25 MHz). The highest frequency band will hereinafter be referred to as a VH band and covers from, for example, CATV JCH (217.25 MHz) to CATV WWCH (430 MHz). The intermediate frequency band will hereinafter be referred to as a VM band and covers from, for example, CATV A-2CH (109.25 MHZ) to on Air broadcast 13CH (211.25 MHz).

Thus, the high frequency amplifier stage is formed of two systems which comprise, as shown in FIG. 1, a high frequency amplifying stage 1 for receiving VL and VM band signals and a high frequency amplifying stage 2 for receiving a VH band signal. The reason for this is that when the three band signals are received by a single common high frequency (HF) amplifier stage, it is difficult to obtain good frequency characteristics over the whole bands. In FIG. 1, reference numeral 3 designates a high frequency amplifying stage which receives a UHF band signal.

Recently, in order to miniaturize and reduce the tuner circuit from a size and money standpoint, it has been proposed to receive three VL, VM and VH band signals by a single common high frequency (HF) amplifier stage 4 as shown in FIG. 2.

FIG. 3 illustrates a practical circuit arrangement of the above-mentioned single common high frequency amplifier stage shown in FIG. 2. In FIG. 3, a λ/4 type of resonant circuit is employed. The fundamental circuit arrangement of the λ/4 type resonant circuit is represented in FIG. 4. Use of the nomenclature relating to λ/4 and λ/2 for resonant circuits in high-frequency tuners is well-known and is based upon distributed constants in a length of coaxial cable. FIGS. 4 and 6 show the lumped constant equivalent circuits for these resonant circuits. Thus, the circuits referred to as λ/4 and λ/2 correspond in function to the known distributed constant, coaxial cable resonant circuits. As shown in FIG. 4, this fundamental circuit comprises coil L and a capacitor C. In this case, its resonant frequency $f_0$ is expressed by the following equation $$f_0 = \frac{1}{2\pi\sqrt{LC}} \quad (1)$$

where L and C are respectively the inductance and the capacitance of the coil and the capacitor.

Referring back to FIG. 3, when receiving the VL band signal, band switching signals "1" (for example, about 9V), "0" (for example, about 0.2 to 0V) and "0" are respectively supplied to band switching terminals 10, 11 and 12 from the external apparatus. A capacitor C1, a variable capacitance diode D1, a capacitor C2 and coils L2, L3 and L6 constitute a λ/4 resonant circuit of the primary side. A capacitor C4, a variable capacitance diode D6, a capacitor C3 and coils L4, L5 and L6 constitute a λ/4 type resonant circuit at the secondary side. A combined capacitance of the variable capacitance diode D1 and the capacitors C1, C2 at the primary side and a combined capacitance of the variable capacitance diode D6 and the capacitors C3, C4 at the secondary side each corresponds to the capacitor C shown in FIG. 4. The coil L in FIG. 4 corresponds to a combined inductance of the coils L2, L3 and L6 at the primary side and to a combined inductance of the coils L4, L5 and L6 at the secondary side.

Referring to FIG. 3, it will be seen that an input signal from an input resonant circuit (not shown) is supplied through a coupling capacitor C0 to a high frequency amplifier 14 formed of a dual gate type metal oxide semiconductor field effect transistor (MOSFET), thereby being amplified. The output of the MOSFET 14 is supplied through a varaible capacitance diode D7 to the primary side of the resonant circuit. The coupling factor of the variable capacitance diode D7 might be varied in response to the frequency. Also, the primary side of the resonant circuit is supplied with a tuning voltage through an input terminal 13 from a channel selecting circuit (not shown). Thus, the tuning of the primary side is effected by varying the capacitance of the variable capacitance diode D1 in the mixed capacitance of the variable capacitance diode D1 and the capacitors C1, C2. On the other hand, the tuning of the secondary side is effected by varying the capacitance of the variable capacitance diode D6 of the mixed capacitance of the variable capacitance diode D6 and the capacitors C3, C4. Then, a desired signal tuned to a predetermined tuned frequency is supplied to a mixing circuit (not shown) from the secondary side of the resonant circuit. A variable capacity diode D8 is used to change the coupling factor of the secondary side of the resonant circuit and the mixing circuit (not shown) in response to the frequency.

When the VM band signal is received, the band switching signals of "0", "1" and "0" are respectively supplied to the band switching terminals 10, 11 and 12 from the external apparatus, whereby the diodes D3 and D4 are turned on. Thus the mixed capacitance of the capacitor C1, the variable capacitance diode D1, the capacitor C2 and a capacitor C2' and the inductance of the coil 2 form the primary side of the λ/4 type resonant circuit, and the mixed capacitance of the capacitor C4, the variable capacitance diode D6, the capacitor C3 and a capacitor C3' and the inductance of the coil L4 forming the secondary side of the λ/4 type resonant circuit. At that time, in the primary side, the variable capacitance diode D1, the capacitors C1, C2 and C2' correspond to the capacitor C shown in FIG. 4, while in the secondary side, the varible capacitance diode D6, the capacitors C3, C3' and C4 correspond to the capacitor C shown in FIG. 4. Also, in the primary side, the coil L2 corresponds to the coil L of FIG. 4, while in the secondary side, the coil L4 corresponds to the coil L of FIG. 4. The tuning is carried out in the same way as that in which the tuning is carried out when the VL band signal is received.

When the VH band signal is received, the band switching signals of "0", "0" and "1" are respectively supplied to the band switching terminals 10, 11 and 12, turning the diodes D2 and D5 on. Thus, mainly the capacitor C1, the variable capacitance diode D1, the capacitor C2, the coil L1 and the capacitor C2″ constitute the λ/4 type resonant circuit of the primary side, whereas mainly the capacitor C4, the variable capacitance diode D6, the capacitor C3, a coil L7 and a capacitor C3″ constitute the λ/4 type resonant circuit of the secondary side. At that time, in the primary side, mainly the variable capacitance diode D1 and the capacitors C1, C2 and C2″ correspond to the capacitor C shown in FIG. 4, while in the secondary side, mainly the variable capacitance diode D6 and the capacitors C3, C3″ and C4 correspond to the capacitor C shown in FIG. 4. Also, mainly the coil L1 in the primary side corresponds to the second coil L in FIG. 4 and mainly the coil L7 in the secondary side corresponds to the coil L in FIG. 4. The inductances of the coils L1 and L7 are small so that when the VH band signals are received, a diode D9 is turned on and the diodes D3 and D4 are also turned on, whereby the coil L2 is connected in parallel to the coil L1 and the coil L4 is connected in parallel to the coil L7, thereby compensating the small inductances of the coils L1 and L7. Further, the tuning is effected in the same way as in the case of the VL and VM band signals.

In FIG. 3, reference numeral CH1 designates a choke coil, R1 an overcurrent preventing resistor and R2 to R6 the bias resistors. The remaining other resistors are all used as the bias resistors.

In case of the circuit system shown in FIG. 3, the inductances of the coils L1 and L7 are not selected so large so that when the VH band signals are received, the circuit loss is increased.

To remove the above-mentioned defects, it is proposed to construct the circuit by a λ/2 type resonant circuit shown in FIG. 5. FIG. 6 shows the fundamental circuit of the λ/2 type resonant circuit which comprises a coil L and capacitors C' and C″. Assuming that L and C', C″ represent the inductance and the capacitances thereof, too, then its resonant frequency f'$_0$ is expressed by the following equation.

$$f_0' = \frac{1}{2\pi\sqrt{L \cdot \frac{C' \cdot C''}{C' + C''}}} \quad (2)$$

If C=C'=C″ is established, the inductance L has to be doubled in order to obtain the same resonant frequency f'$_0$. In other words, the larger the L/C becomes the higher the Q becomes, thus the circuit loss becomes small.

Turning back to FIG. 5, when the VL band signals are received, the band switching signals "1", "0" and "0" are respectively supplied to the band switching terminals 10, 11 and 12 from the external apparatus. Then, the capacitor C5, the variable capacitance diode D10, the coil L8, the variable capacitance diode D11, the capacitor C6, the coils L9, L10 and L11 constitute the λ/2 type resonant circuit of the primary side, whereas the capacitor C7, the variable capacitance diode D12, the coil L12, the variable capacitance diode D13, the capacitor C8, and the coils L13, L14 and L11 constitute the λ/2 type resonant circuit of the secondary side. In that event, to the capacitors C' and C″ shown in FIG. 6, in the primary side, there correspond the capacitor C5 and the variable capacitance diode D10 and, the variable capacitance diode D11 and the capacitor C6, while in the secondary side, these correspond the capacitor C8 and the variable capacitance diode D13 and the varable capacitance diode D12 and the capacitor C7, respectively. Further, the coils L8, L9, L10 and L11 of the primary side correspond to the coil L shown in FIG. 6, and the coils L12, L13, L14 and L11 of the secondary side correspond to the coil L shown in FIG. 6.

Turning back to FIG. 5, the input signal from the input tuning circuit is supplied to a dual gate type MOSFET 14, in which it is amplified and is then fed to the primary side of the resonant circuit. The tuning at the primary side is effected by varying the capacitances of the variable capacitance diodes D10 and D11, while the tuning at the secondary side is effected by varying the capacitances of the variable capacitance diodes D12 and D13 by a tuning voltage from the input terminal 13. Then, a desired signal tuned to a predetermined frequency is supplied to the mixing circuit from the secondary side of the resonant circuit.

When the VM band signals are received, the band switching signals "0", "1" and "0" are respectively supplied to the band switching terminals 10, 11 and 12, whereby the diodes D14 and D15 are turned on. Thus, the capacitor C5, the variable capacitance diode D10, the coil L8, the variable capacitance diode D11, the capacitor C6, the coil L9 and the capacitor C6' constitute the λ/2 type resonant circuit of the primary side. Further, the capacitor C7, the variable capacitance diode D12, the coil L12, the variable capacitance diode D13, the capacitor C8, the coil L13 and the capacitor C8' constitute the λ/2 type resonant circuit of the secondary side. At that time, the capacitors C' and C″ shown in FIG. 6 correspond respectively to the capacitor C5 and the variable capacitance diode D10 and to the variable capacitance diode D11 and the capacitors C6, C6' at the primary side, and correspond respectively to the capacitors C8, C8' and the variable capacitance diode D13 and to the variable capacitance diode D12 and the capacitor C7 at the secondary side. The coil L of FIG. 6 corresponds to the coils L8 and L9 at the primary side and corresponds to the coils L12 and L13 at the secondary side. The tuning is effected similarly to that of the VL band signals.

When the VH band signals are received, the band switching signals of "0", "0" and "1" are respectively supplied to the band switching terminals 10, 11 and 12 from the external circuit, whereby the diodes D16 and D17 are turned on. Thus, mainly the capacitor C5, the variable capacitance diode D10, the coil L8, the variable capacitance diode D11 and the capacitors C6, C6″ constitute the λ/2 type resonant circuit of the primary side. On the other hand, mainly the capacitor C7, the variable capacitance diode D12, the coil L12, the variable capacitance diode D13 and the capacitors C8, C8″ constitute the λ/2 type resonant circuit of the secondary side. In that event, the capacitors C' to C″ shown in FIG. 6 correspond respectively to the capacitor C5 and the variable capacitance diode D10 and to the variable capacitance diode D11 and the capacitors C6, C6" at the primary side, and correspond respectively to the capacitors C8, C8" and the variable capacitance diode D13 and to the variable capacitance diode D12 and the capacitor C7 at the secondary side. The coil L shown in FIG. 6 corrresponds to the coil L8 at the primary side and to the coil L12 at the secondary side.

When receiving the VH band signals, the diode D18 is turned on and the diodes D14 and D15 are turned on, whereby the coil L9 is serially connected to the coil 18 and the coil L13 is serially connected to the coil L12 thereby compensating for the inductances thereof. The tuning is effected similarly to those of the VL and VM band signals.

In case of the circuit system shown in FIG. 5, the inductances of the coils L8 and L12 corresponding to the coils L1 and L7 of the circuit shown in FIG. 3 can be selected to be large so that while the circuit loss when the VH band signals are received is small, many circuits are commonly used for the respective band signals. Thus, it is difficult to balance the characteristics of the resonant circuits among the respective band signals.

OBJECTS AND SUMMARY OF THE INVENTION

It is an object of the present invention to provide an improved tuner circuit which can obviate the above-mentioned defects encountered with the prior art.

It is another object of the present invention to provide a tuner circuit in which while the balances of the characteristics of the resonant circuits for the respective band signals can be maintained satisfactorily, the circuit loss of the highest band signals (VH band signals) can be reduced.

According to an aspect of the present invention, there is provided a tuner circuit comprising:

(a) an input terminal for supplying a plurality of different band signals;

(b) a high frequency amplifier connected to said input terminal;

(c) a resonant circuit connected to said amplifier; and (d) band switching means connected to said resonant circuit, characterized in that said resonant circuit is switchable between $\lambda/2$ and $\lambda/4$ types of resonant circuits, and said band switching means switches said resonant circuit to $\lambda/2$ type when said amplifier receives the highest band signals and to $\lambda/4$ type when said amplifier receives other band signals than said highest band signals.

According to another aspect of the present invention, there is provided a tuner circuit comprising:

(A) an input terminal for supplying a plurality of different band signals;

(B) a high frequency amplifier connected to said input terminal;

(C) a resonant circuit connected to said high frequency amplifier;

(D) a variable capacitor circuit connected to said high frequency amplifier via a first capacitor;

(E) first band switching means for the highest band signals connected to said variable capacitor circuit;

(F) second band switching means for other band signals connected to said variable capacitor circuit via a second capacitor; and (G) band switching signal supplying means connected to said first and second band switching means, characterized in that said first band switching means makes said resonant circuit a $\lambda/2$ type resonant circuit when operated, and said second band switching means makes said resonant circuit a $\lambda/4$ type resonant circuit when operated.

According to a further aspect of the present invention, there is provided a tuner circuit comprising:

(1) an input terminal for supplying a plurality of different band signals;

(2) a common high frequency amplifier connected to said input terminal;

(3) resonant circuit means connected to said amplifier;

(4) a variable capacitor circuit connected to said amplifier via a first capacitor;

(5) a first band switching circuit connected to said amplifier opposite to said variable capacitor circuit seen from said first capacitor; and (6) a second band switching circuit connected to said variable capacitor circuit via a second capacitor.

These and other objects, features and advantages of the present invention will be apparent in the following detailed description of preferred embodiments of the invention when read in conjunction with the accompanying drawings, in which like reference numerals are used to identify the same or similar parts.,

DETAILED DESCRIPTION OF PREFERRED EMBODIMENTS

Figure 1:
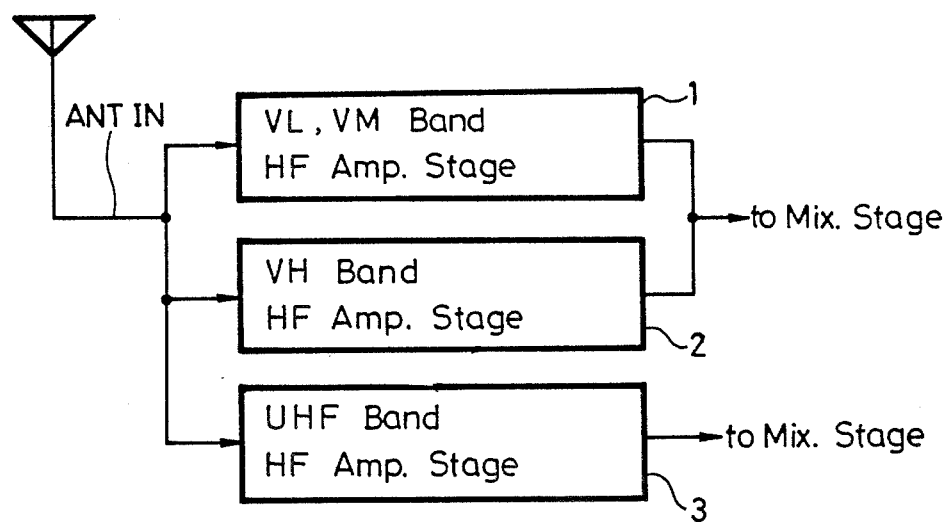
FIG. 1 is a schematic diagram showing an example of a high frequency amplifier stage of a prior-art tuner circuit.
Figure 2:
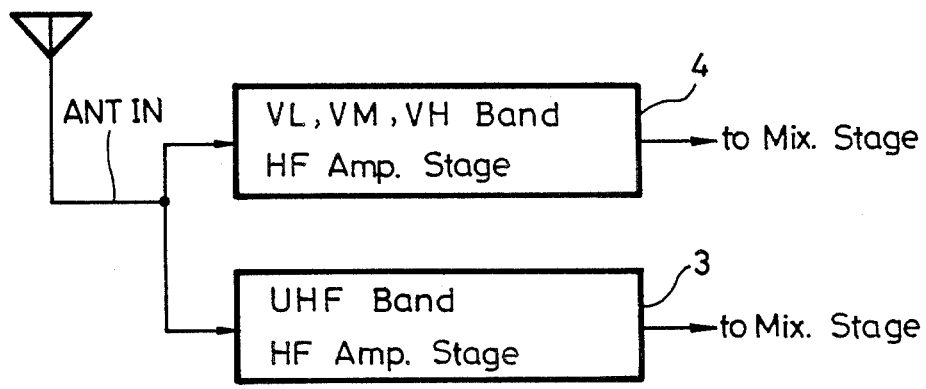
FIG. 2 is a schematic diagram showing another example of the high frequency amplifier stage of a prior-art tuner circuit.
Figure 3:
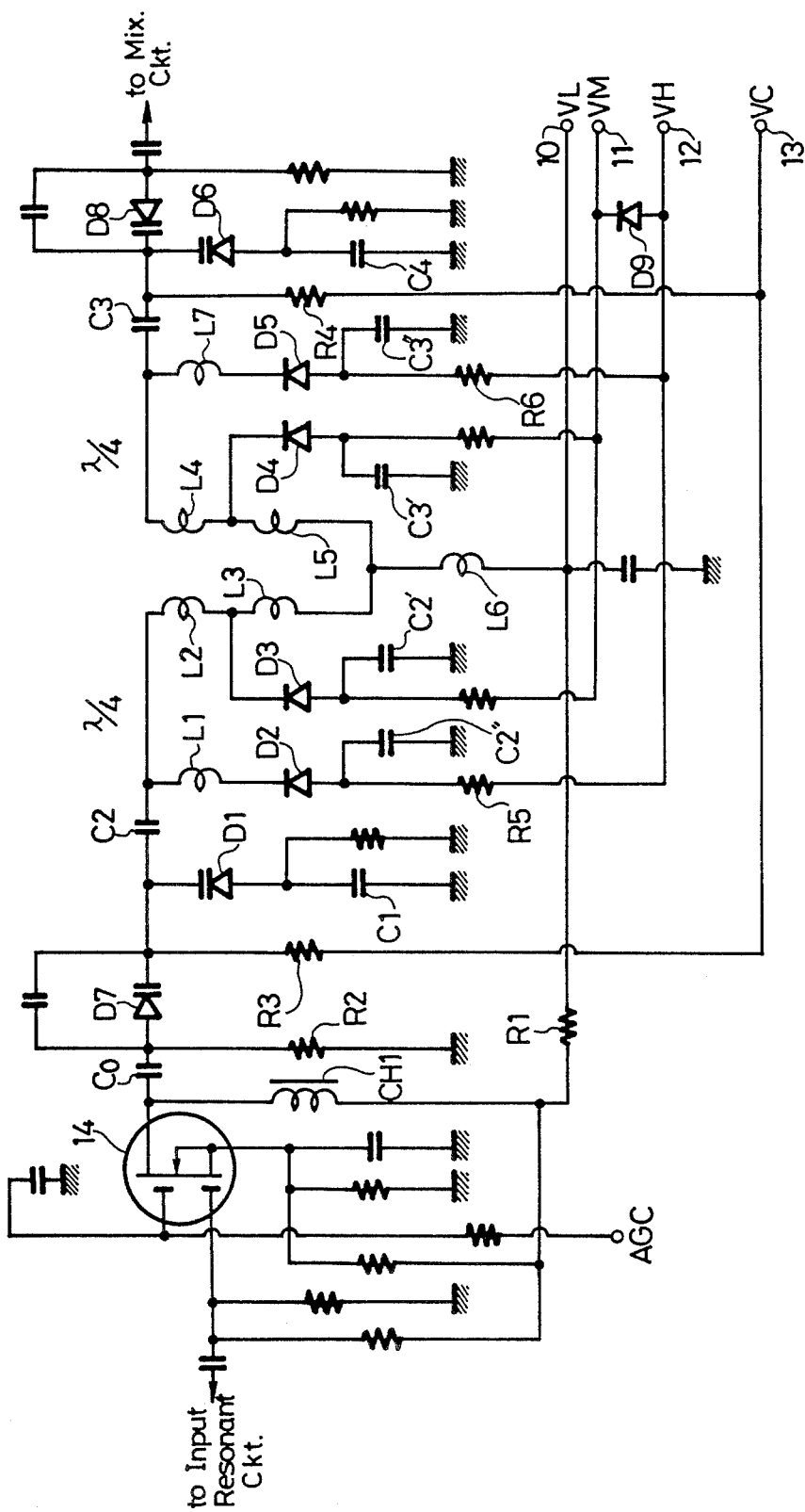
FIG. 3 is a schematic diagram showing an example of a prior-art high frequency amplifying stage having a $\lambda/4$ type resonant circuit.
Figure 5:
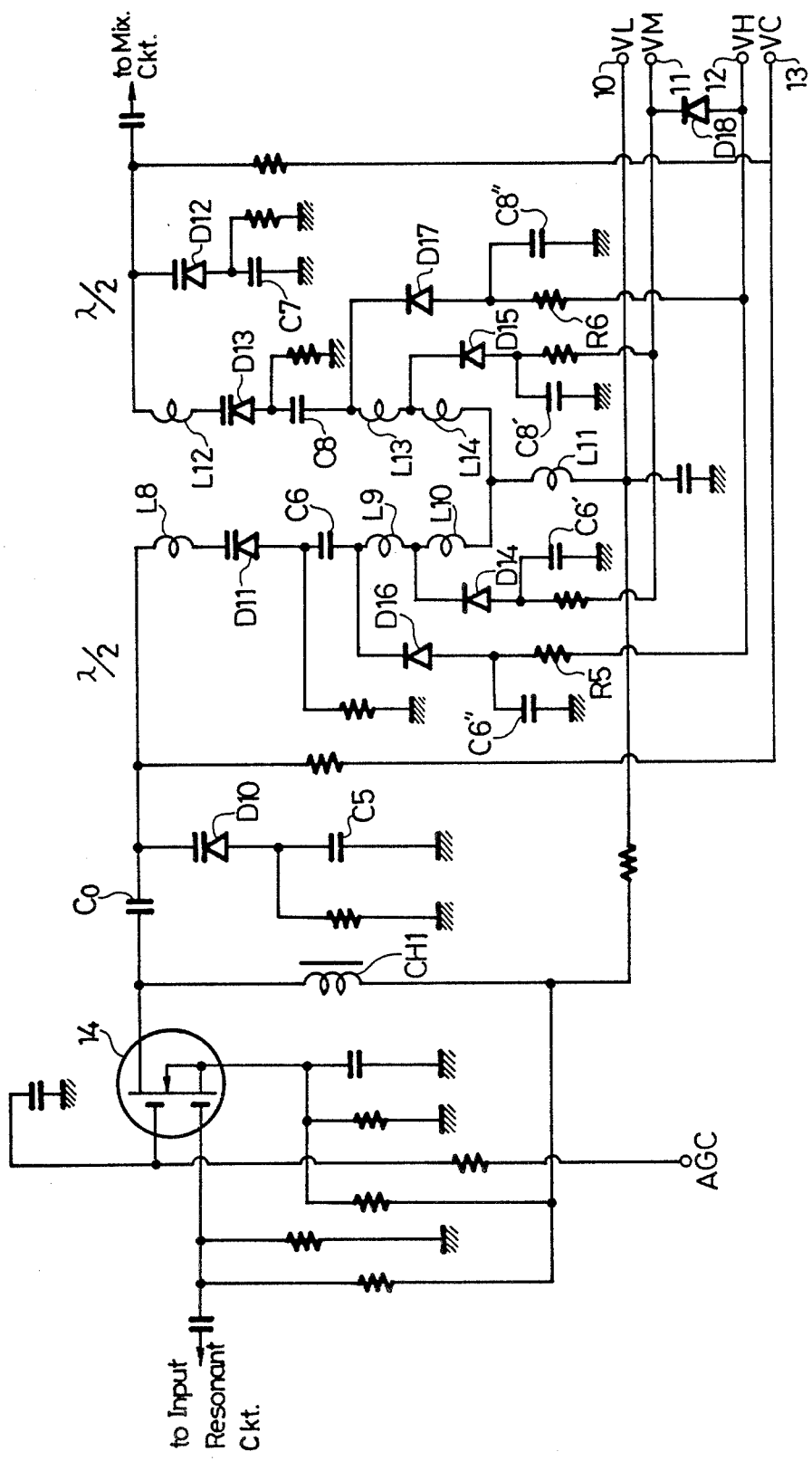
FIG. 5 is a schematic diagram showing an example of a prior-art high frequency amplifying stage of a $\lambda/2$ type resonant circuit.
Figure 7:
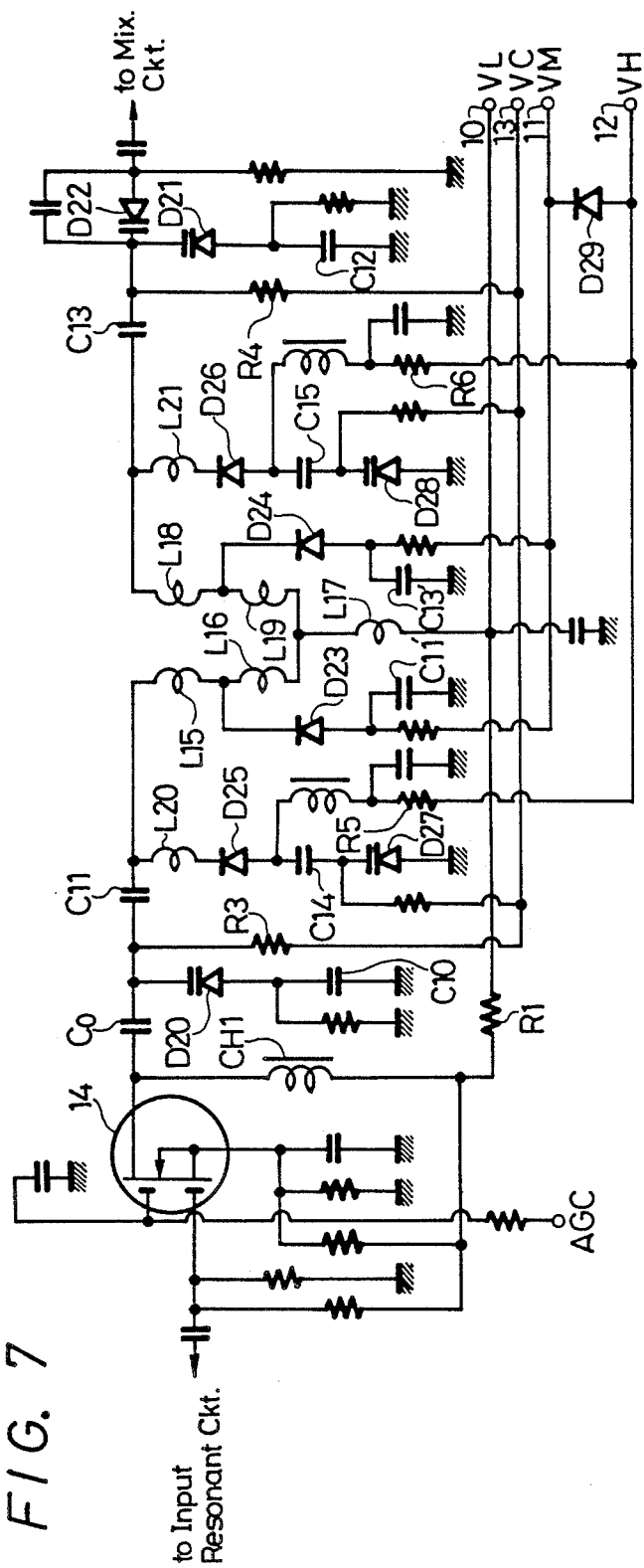
FIG. 7 is a block diagram showing an embodiment of a tuner circuit according to the present invention.

An embodiment of a tuner circuit according to the present invention will hereinafter be described in detail with reference to FIG. 7. In FIG. 7, like parts corresponding to those of FIGS. 3 and 5 are marked with the same references and therefore need not be described in detail.

Figure 4:
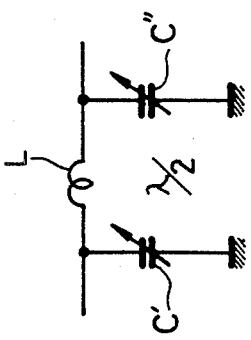
FIG. 4 is a schematic diagram showing a fundamental circuit of a $\lambda/4$ type resonant circuit.

According the circuit of the present invention shown in FIG. 7, when the VL band signals are received, the band switching signals of "1", "0" and "0" from the external circuit are respectively supplied to the band switching terminals 10, 11 and 12, whereby a capacitor C10, a variable capacitance diode D20, a capacitor C11 and coils L15, L16 and L17 constitute a $\lambda/4$ type resonant circuit of the primary side, while a capacitor C12, a variable capacitance diode D21, a capacitor C13 and coils L18, L19 and L17 constitute the λ/4 type resonant circuit of the secondary side. In that event, the capacitor C shown in FIG. 4 corresponds to the mixed capacitance of the capacitor C10, the variable capacitance diode D20 and the capacitor C11 in the primary side, and corresponds to the mixed capacitance of the capacitor C12, the variable capacitance diode D21 and the capacitor C13 in the secondary side. The coil L shown in FIG. 4 corresponds to the mixed inductance of the coils L15, L16 and L17 in the primary side and corresponds to the mixed inductance of the coils L18, L19 and L17 in the secondary side.

The input signal from the input tuning circuit (not shown) is supplied to the dual gate type MOSFET 14, wherein it is amplified and is then fed to the primary side of the resonant circuit. Thus, on the basis of the tuning voltage from the input terminal 13, when the capacitance of the variable capacitance diode D20 is varied, the tuning of the primary side is effected, while when the capacitance of the variable capacitance diode D21 is varied, the tuning in the secondary side is effected. From the secondary side of the resonant circuit, there is supplied a desired signal tuned to a predetermined tuning frequency to a mixer circuit (not shown) via a variable capacitance diode D22 which varies the coupling factor between the secondary side of the resonant circuit and the mixing circuit in response to the frequency.

When the VM band signals are received, the band switching signals "0", "1" and "0" are respectively supplied to the band switching terminals 10, 11 and 12 from the external circuit, whereby diodes D23 and D24 are both turned on. Thus, the capacitor C10, the variable capacitance diode D20, the capacitor C11, the coil L15 and a capacitor C11' constitute the λ/4 type resonant circuit of the primary side, whereas the capacitor C12, the variable capacitance diode D21, the capacitor C13, the coil L18 and the capacitor C13' constitute the λ/4 type resonant circuit of the secondary side. In that event, the capacitor C shown in FIG. 4 corresponds to the mixed capacitance of the capacitor C10, the variable capacitance diode D20 and the capacitors C11 and C11' in the primary side, and corresponds to the mixed capacitance of the capacitor C12, the variable capacitance diode D21 and the capacitors C13, C13' at the secondary side. The coil L shown in FIG. 4 corresponds to the coil L15 at the primary side and to the coil L18 at the secondary side. The tuning can be carried out similarly to that of the VL band signals.

Figure 6:
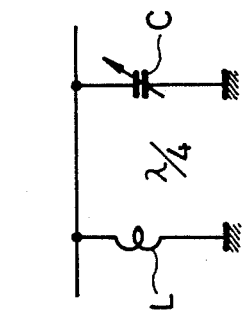
FIG. 6 is a schematic diagram showing a fundamental circuit of a $\lambda/2$ type resonant circuit.

When the VH band signals are received, the band switching signals "0", "0" and "1" from the external circuit are respectively supplied to the band switching terminals 10, 11 and 12, whereby diodes D25 and D26 are turned on. Thus, mainly the capacitor C10, the variable capacitance diode D20, the capacitor C11, the coil L20, the capacitor C14 and the variable capacitance diode D27 constitute the λ/2 type resonant circuit of the primary side, whereas mainly the capacitor C12, the variable capacitance diode D21, the capacitor C13, the coil L21, a capacitor C15 and the variable capacitance diode D28 constitute the λ/2 type resonant circuit of the secondary side. In that event, the capacitors C' and C" shown in FIG. 6 respectively correspond to the capacitor C10 and the variable capacitance diode D20 and to the capacitor C14 and the variable capacitance diode D27 at the primary side. On the other hand, the capacitors C' and C" shown in FIG. 6 respectively correspond to the variable capacitance diode D28 and the capacitor C15 and to the variable capacitance diode D21 and the capacitor C12 at the secondary side. The coil L shown in FIG. 6 corresponds to the coil L20 at the primary side and to the coil L21 at the secondary side.

Further, when the VH band signals are received, a diode D29 is turned on and the diodes D23 and D24 are turned on. Also, the coil L15 is connected in parallel to the coil L20 and the coil L18 is also connected in parallel to the coil L21, thereby compensating for the inductances thereof. The tuning is carried out in the same way as that of the VM band signals.

As set out above, according to this embodiment, when the VH band signals are received, the resonant circuit is formed to be the λ/2 type, so that the inductances of the coils L20 and L21 can be increased. Thus, it is possible to reduce the circuit loss when the VH band signals are received.

Further, when the VL and VM band signals are received, the resonant circuit is formed to be the λ/4 type, while the resonant circuit is formed to be the λ/2 type when the VH band signals are received. Thus, the use of the common parts is limited as much as possible, whereby the balance of the characteristics of the resonant circuits for respective band signals can be maintained satisfactory.

As described above, according to the present invention, in the case where the plurality of band signals are received by the single common high frequency amplifying stage, when the highest frequency band signal is received, the resonant circuit is switched to the λ/2 type resonant circuit, while when other band signals than the highest band signal are received, the resonant circuit is switched to the λ/4 type resonant circuit. Therefore, while maintaining the balances of the characteristics of the resonant circuit for the respective bands satisfactorily, the circuit loss at the highest band signals can be reduced.

Figure 8:
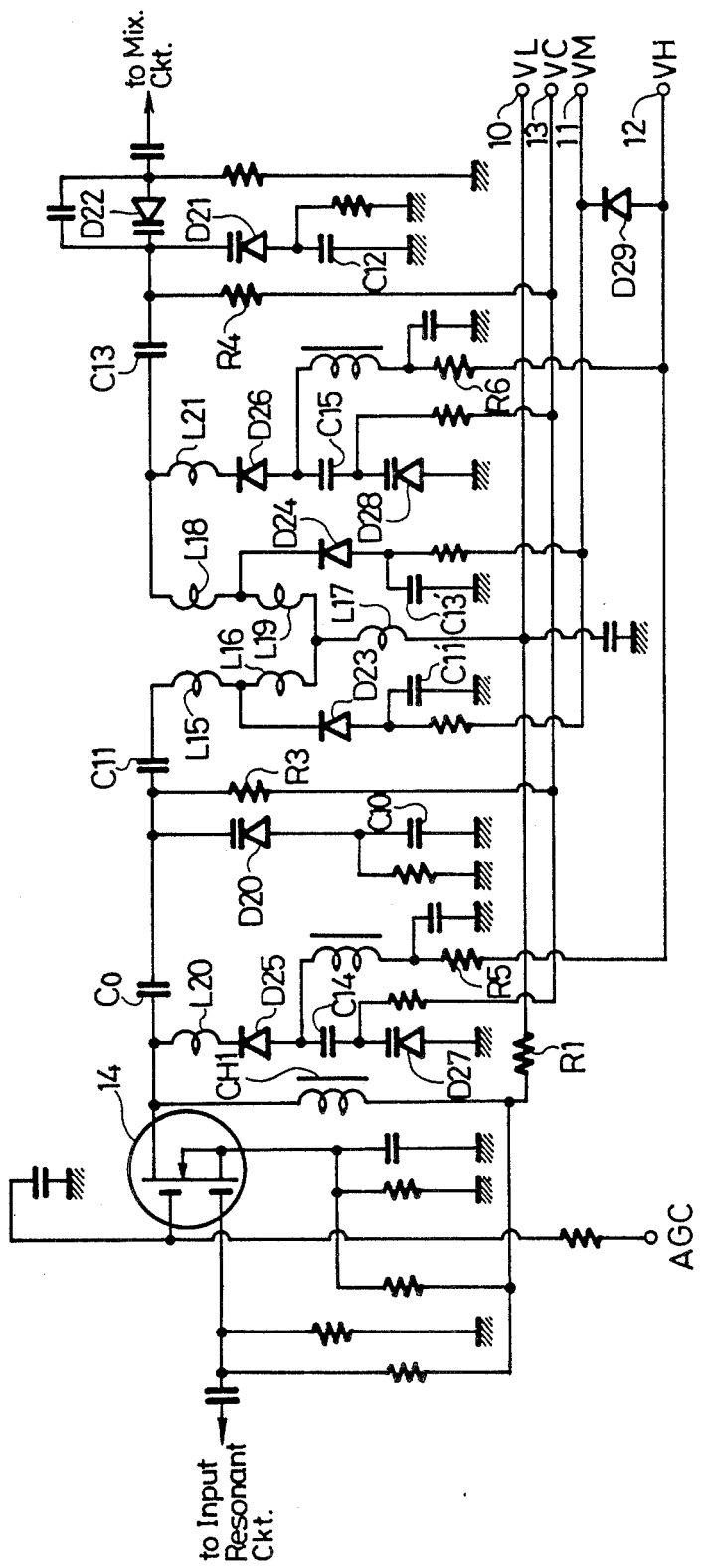
FIG. 8 is a block diagram showing another embodiment of a tuner circuit according to the present invention.

FIG. 8 is a schematic diagram showing another embodiment of a tuner circuit according to the present invention, in which the circuit of FIG. 7 is improved. In FIG. 8, parts corresponding to those of FIG. 7 are marked with the same references and therefore need not be described in detail.

Referring to FIG. 8, it will be seen that one end of the coil L20 forming the first band switching circuit for switching the VH band signals together with the diode D25 is connected to a junction among the drain of the FET 14 and the choke coil CH1 and one end of the capacitor $C_0$. Then, one end of the variable capacitance diode D20, which forms a variable capacitor circuit together with the capacitor $C_0$, is connected through the capacitor $C_0$ to the first band switching circuit and is also connected through the capacitor C11 to one end of the coil L15 which forms the second band switching circuit together with the diode D23. One end of the coil L20 of the first band switching circuit is dc-coupled to the drain of the FET 14.

Thus, when the VL and VM band signals are received, operations similar to those of FIG. 7 are carried out. When the VH band signals are received, the capacitor C10, the variable capacitance diode D20, the capacitor $C_0$, the coil L20, the capacitor C14 and the variable capacitance diode D27 constitute a resonant circuit at the primary side of a double tuned circuit. Thus, the capacitor C11 is replaced with the capacitor $C_0$. In this case, if the capacitance value of the capacitor C10 is selected in response to the tracking characteristics of the VL and VM band signals, then in the VH band signals, the tracking characteristic is determined by, for example, the capacitor C14, and the tracking characteristic and the L/C ratio of the resonant circuit or the like are determined by the capacitor $C_0$. Thus, various characteristics of the respective band signals are determined with ease.

According to the embodiment shown in FIG. 8, since the first and second band switching circuits are connected in capacitance fashion to the upper and lower stages with the common variable capacitor circuit which is supplied with the output of the high frequency amplifying circuit, and the first band switching circuit is also dc-coupled to the output side of the high frequency amplifying circuit, the capacitance, which is used in the prior art as the dc-block for the high frequency amplifying circuit and the resonant circuit and which hardly contributes to determining the L/C ratio of the resonant circuit, can contribute to determining the L/C ratio of the resonant circuit and the tracking characteristics or the like without increasing the number of parts. Therefore, various characteristics of the respective band signals can be designed with ease. Thus, the tuner circuit of the present invention is very useful in the application to the complicated circuit formed of 3 band signals.

It should be understood that the above description of the preferred embodiments of the invention is presented by way of example and it will be apparent that many modifications and variations thereof could be effected by one with ordinary skill in the art without departing from the spirit and scope of the novel concepts of the invention so that the scope of the invention should be determined only by the appended claims.

We claim as our invention:

1. A tuner circuit comprising:
an input terminal for supplying a plurality of different band signals including highest band signals;
a high frequency amplifier connected to said input terminal;
a resonant circuit connected to said amplifier; and
band switching means connected to said resonant circuit,
characterized in that
said resonant circuit is switchable between $\lambda/2$ and $\lambda/4$ types of resonant circuits, and said band switching means switches said resonant circuit to $\lambda/2$ type when said amplifier receives the highest band signals and to $\lambda/4$ type when said amplifier receives band signals other than said highest band signals.

2. A tuner circuit according to claim 1, wherein said plurality of different band signals are VHF low, middle and high channel signals.

3. A tuner circuit according to claim 2, wherein said resonant circuit is a double tuned resonant circuit and primary and secondary resonant circuits thereof are synchronously switched between $\lambda/2$ and $\lambda/4$ types of resonant circuits.

4. A tune circuit comprising:
an input terminal for supplying a plurality of different band signals including highest band signals;
a high frequency amplifier connected to said input terminal;
a resonant circuit connected to said high frequency amplifier;
first and second capacitors;
a variable capacitor circuit connected to said high frequency amplifier via said first capacitor;
first band switching means for the highest band signals connected to said variable capacitor circuit;
second band switching means for other band signals connected to said variable capacitor circuit via said second capacitor;
band switching signal supplying means connected to said first and second band switching means,
characterized in that
said first band switching means makes said resonant circuit a $\lambda/2$ type resonant circuit when operated, and said second switching means makes said resonant circuit a $\lambda/4$ type resonant circuit when operated.

5. A tuner circuit according to claim 4, wherein said first band switching means is connected to said amplifier side seen from said first capacitor.

6. A tuner circuit according to claim 5, wherein said first band switching means is direct current coupled to said amplifier, said plurality of different band signals are VHF low, middle and high channel signals, and said resonant circuit is a double tuned resonant circuit.

7. A tuner circuit comprising:
an input terminal for supplying a plurality of different band signals including highest band signals;
a common high frequency amplifier connected to said input terminal;
resonant circuit means connected to said amplifier;
first and second capacitors;
a variable capacitor circuit connected to said amplifier via said first capacitor;
a first band switching circuit corresponding to said highest band signals connected to said amplifier opposite to said variable capacitor circuit seen from said first capacitor; and
a second band switching circuit corresponding to other band signals of said plurality connected to said variable capacitor circuit via said first and second capacitors.

8. A tuner circuit according to claim 7, wherein said first band switching circuit is direct current coupled to said amplifier.

9. A tuner circuit according to claim 7, wherein said first band switching circuit makes said resonant circuit means a $\lambda/2$ type resonant circuit when operated, and said second band switching circuit makes said resonant circuit means a $\lambda/4$ resonant circuit when operated.

10. A tuner circuit according to claim 9, wherein said resonant circuit means is a double tuned resonant circuit including said variable capacitor circuit and said first and second band switching circuits.

* * * * *

UNITED STATES PATENT AND TRADEMARK OFFICE
CERTIFICATE OF CORRECTION

PATENT NO. : 4,972,509
DATED : November 20, 1990
INVENTOR(S) : Kazuhiko Maejima It is certified that error appears in the above-identified patent and that said Letters Patent is hereby corrected as shown below:

Col. 1, line 66, after "comprises" insert --a--

Col. 2, lines 64 and 65, change "forming" to --form--

Col. 5, line 12, change "18" to --L8--

Col. 6, line 28, delete ","

Col. 10, line 55, after " $\lambda$4" insert --type--

Signed and Sealed this

Twenty-ninth Day of September, 1992

Attest:

DOUGLAS B. COMER

*Attesting Officer*   Acting Commissioner of Patents and Trademarks